United States Patent
Saxena et al.

(10) Patent No.: US 12,349,436 B2
(45) Date of Patent: Jul. 1, 2025

(54) TERMINATION BALLAST TO SUPPRESS HOTSPOT FORMATION IN TRENCH FIELD PLATE POWER MOSFETS

(71) Applicant: NXP USA, INC., Austin, TX (US)

(72) Inventors: Tanuj Saxena, Chandler, AZ (US);
Christian Torrent, Montauban (FR);
Vishnu Khemka, Chandler, AZ (US);
Ganming Qin, Chandler, AZ (US);
Moaniss Zitouni, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 437 days.

(21) Appl. No.: 17/804,147

(22) Filed: May 26, 2022

(65) Prior Publication Data
US 2022/0393004 A1 Dec. 8, 2022

(30) Foreign Application Priority Data
Jun. 3, 2021 (EP) .................................... 21305748

(51) Int. Cl.
| | |
|---|---|
| H01L 29/40 | (2006.01) |
| H10D 30/01 | (2025.01) |
| H10D 30/66 | (2025.01) |
| H10D 64/00 | (2025.01) |
| H10D 64/01 | (2025.01) |
| H10D 64/23 | (2025.01) |
| H10D 84/00 | (2025.01) |

(52) U.S. Cl.
CPC ....... *H10D 64/117* (2025.01); *H10D 30/0297* (2025.01); *H10D 30/665* (2025.01); *H10D 30/668* (2025.01); *H10D 64/01* (2025.01); *H10D 64/258* (2025.01); *H10D 84/141* (2025.01)

(58) Field of Classification Search
None
See application file for complete search history.

(56) References Cited

U.S. PATENT DOCUMENTS

| | | |
|---|---|---|
| 5,498,892 A | 3/1996 | Walker et al. |
| 6,437,419 B1 | 8/2002 | Bhalla et al. |
| 10,103,257 B1 | 10/2018 | Qin et al. |
| 10,431,678 B2 | 10/2019 | Qin et al. |

(Continued)

OTHER PUBLICATIONS

Komatsu, K., "Novel procedure to improve LDMOS ESD characteristics by optimizing drain structure", Proceedings of the 2016 28th International Symposium on Power Semiconductor Devices and ICs (ISPSD), Jun. 12-16, 2016.

(Continued)

*Primary Examiner* — William C Trapanese

(57) ABSTRACT

A high voltage trench field plate power MOSFET device is fabricated in a substrate having first and second trenches separated from one another by a narrow epitaxial semiconductor drift pillar structure, where insulated gate electrode layers and insulated field plate layers are formed in the first and second trenches, and where a body well region is formed in an upper portion of the narrow epitaxial semiconductor drift pillar structure to include source contact regions in an active area, and to include an integrated ballast resistor section which connects one or more of the source contact regions to the termination area and which has no source contact regions.

19 Claims, 9 Drawing Sheets

(56) References Cited

U.S. PATENT DOCUMENTS

| | | |
|---|---|---|
| 10,811,502 B1 | 10/2020 | Khemka et al. |
| 2019/0280117 A1 | 9/2019 | Mirchandani et al. |
| 2020/0027876 A1* | 1/2020 | Obu ........................ H01L 24/16 |
| 2021/0043741 A1 | 2/2021 | Hu et al. |

OTHER PUBLICATIONS

Vanmeerbeek, P., "Enhancing the robustness of a multiple floating field-limiting ring termination by introducing a buffer layer", 2012 24th International Symposium on Power Semiconductor Devices and ICs, Jun. 3-7, 2012.

* cited by examiner

TERMINATION BALLAST TO SUPPRESS HOTSPOT FORMATION IN TRENCH FIELD PLATE POWER MOSFETS

CROSS-REFERENCE TO RELATED APPLICATIONS

This application claims the priority under 35 U.S.C. § 119 of European Patent application no. 21305748.2, filed on 3 Jun. 2021, the contents of which are incorporated by reference herein.

FIELD OF THE INVENTION

The present invention is directed in general to semiconductor devices and methods for manufacturing same. In one aspect, the present invention relates to a semiconductor design of a trench field plate power MOSFET with reduced avalanche hotspot formation and associated methods of fabricating and using same.

BACKGROUND

Trench field plate (or shielded gate) power MOSFETs are the dominant designs for low-voltage power switches due to their superior breakdown voltage (BV) and on-resistance trade-off. Owing to the nature of the reduced surface field (RESURF) action in these devices, the breakdown voltage shows high sensitivity to different parameters, such as silicon mesa width, drift doping, field plate dielectric thickness, trench depth, etc. This high sensitivity of the breakdown voltage makes the layout design of these devices significantly challenging, and there are special challenges with the design of the termination region which can degrade the breakdown voltage and undermine the design of the active regions. Even with an acceptable breakdown voltage, certain termination region designs can be prone to avalanche hotspot formation and second breakdown. For example, unclamped inductive switching (UIS) experiments reveal that the avalanche current during the off-state is shared between the active and termination regions, but since the termination region occupies only a small fraction of the total device area, termination hotspot induced failures may occur at low overall currents. As seen from the foregoing, there are difficulties with designing trench field plate power MOSFETs that provide good breakdown voltage performance in combination with high UIS capability by virtue of the difficulty, cost, and delay required to redesign the termination region device layout which suppresses hotspot formation.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
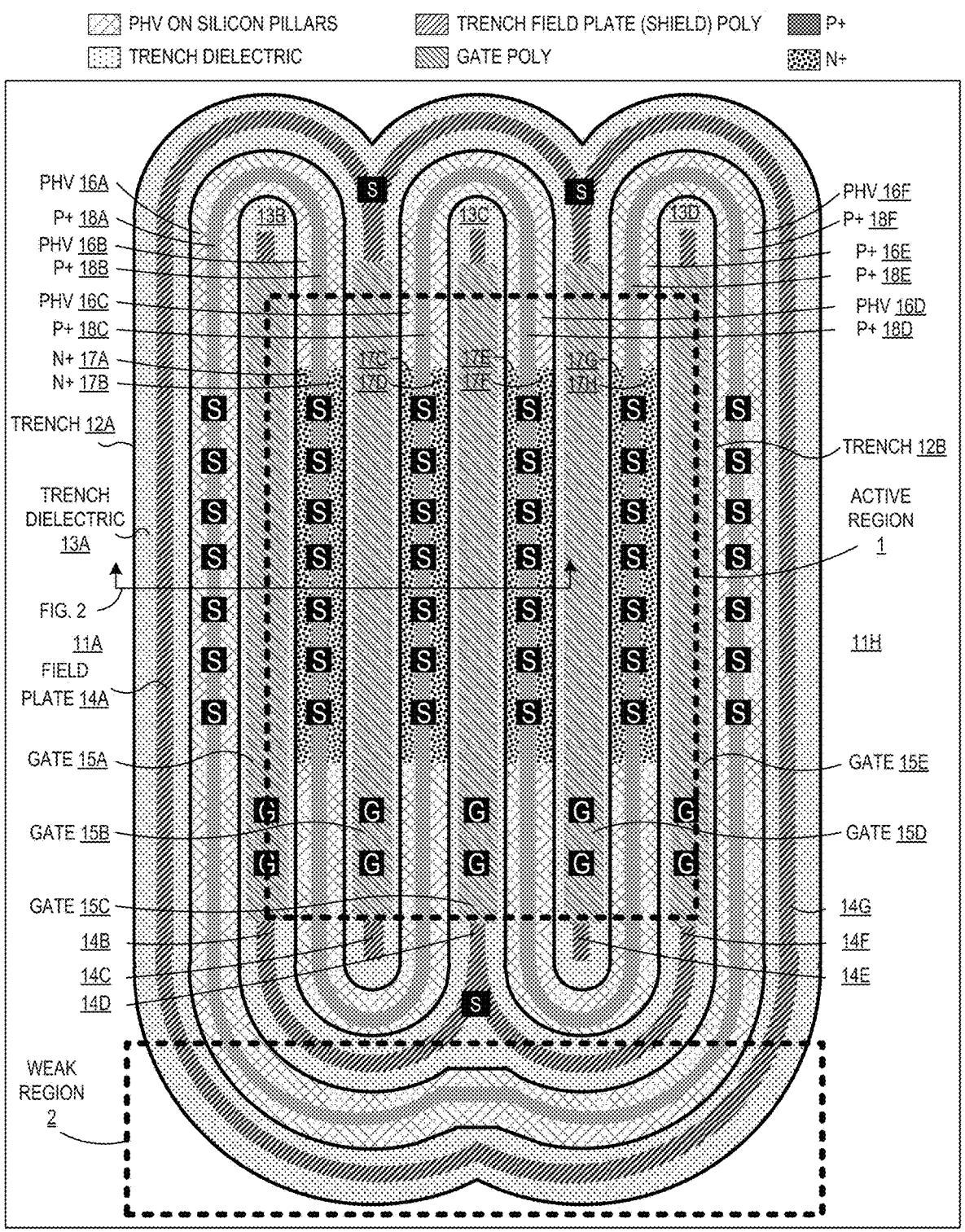
FIG. 1 is a plan view of a trench field plate power MOSFET having a weak or vulnerable termination region in which avalanche hotspots can occur at low overall currents.

A high voltage vertical field effect transistor device and associated fabrication process are described for providing improved voltage breakdown characteristics with avalanche hotspot mitigation by integrating termination ballast resistance between vulnerable regions and a nearby source contact of the transistor device. In selected embodiments, the termination ballast resistance is integrated by forming narrow body implant regions (e.g., p-type high voltage (PHV) regions) which have a specified minimum sheet resistance and which extend through the vulnerable termination region(s). To maintain the required termination ballast resistance, the device fabrication sequence is controlled to prevent the formation of conductive regions (e.g., P+ regions) on top of the narrow body implant regions. For example, any P+ implantation process may include an implant mask that is defined to prevent implantation of P+ regions into the narrow body implant regions that form the termination ballast resistance. In addition to increasing the ballast resistance, the removal of P+ regions also allows the electric field profile to spread further at high currents, thereby delaying the onset of double injection and negative differential resistance (NDR) branches. By providing a lightly doped and long p-type body implant in the vulnerable termination region, a positive self-bias can be provided in the Ohmic regime or in a space-charge controlled regime. In either case, the onset of NDR branches can be very effectively delayed. For large area devices, an additional ballast resistance element can be included with a negligible area penalty. Furthermore, no additional process complexity is introduced in this design in embodiments where the termination ballast resistance is added by using existing implant and contact masks to prevent implantation of P+ regions, thus making it an attractive choice to mitigate avalanche hotspots in the termination region.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention. Further, reference numerals have been repeated among the drawings to represent corresponding or analogous elements. In addition, the depicted device layers that are shown as being deposited and/or etched are represented with simplified line drawings, though it will be appreciated that, in reality, the actual contours or dimensions of device layers will be non-linear, such as when the described etch processes are applied at different rates to different materials, or when the described deposition or growth processes generate layers based on the underlaying materials.

As indicated above, there are difficulties with designing trench field plate power MOSFETs that provide good breakdown voltage performance and also handling hotspot avalanche current that arises due to termination diode current-voltage characteristics of existing devices. For example, trench field plate power MOSFET devices have been developed as an ultra-low resistance technology for 80-100 V automotive applications which provide good static performance, but which exhibit poor unclamped inductive switching (UIS) capability. Through experimental observation, it is seen that device destruction took place at the termination region of the device die in a very small spot for current densities as low as 1 A/mm$^2$.

To provide a contextual understanding for selected embodiments of the present disclosure, reference is now made to FIG. 1 which depicts a plan view of a trench field plate power MOSFET device 100 having a weak or vulnerable termination region 2 in which avalanche hotspots can occur at low overall currents. For clarity of the exposition, the following description is provided with reference to an n-channel FET (NFET) embodiment, but it will be appreciated that a p-channel FET (PFET) embodiment may also be used in which case the doping polarities of the PFET are reversed from the NFET.

As depicted, the device 100 includes a first gate 15A in parallel with a second gate 15C and a third gate 15E. A fourth gate 15B is interposed between the first gate 15A and the second gate 15C. A fifth gate 15D is interposed between the second gate 15C and the third gate 15E. In addition, the device includes a first shield 14B, 14D, 14F (a.k.a. trench field plate) that is formed with a deposited polysilicon layer in a first trench 12B. The first gate 15A, the second gate 15C, and the third gate 15E are formed with a second polysilicon layer deposited over the first shield 14B, 14D, 14F with dielectric isolation. The portions of the shield that extend between the overlying gates and the drain are referred to a partial shields. Conversely, the portions of the shield that are not covered by a gate that extend between the surface of the semiconductor and the drain are referred to as full shields. The partial shields extend along their respective trenches in a middle region. The full shields extend along their respective trenches in the top region and the bottom region.

In the depicted device 100, the first shield 14B, 14D, 14F forms a continuous conduction path connecting the partial shields underlying the first gate 15A, the second gate 15C, and the third gate 15E. Similarly, a second shield 14A, 14C, 14E, 14G in a second trench 12A forms a continuous conduction path connecting the partial shields underlying the fourth gate 15B and the fifth gate 15D. The second shield 14A, 14C, 14E, 14G further encircles the five gates 15A-E to form a continuous shield around the inter-active area including the gates. While the depicted device 100 has five interleaved gate fingers, it will be appreciated that a different odd number of fingers may be used (e.g., three, seven, nine, or greater odd numbers) with a similar layout having a scalloped shaped second shield 14A, 14C, 14E, 14G (or series of semicircular portions) encircling a first shield 14B, 14D, 14F. As formed, the first shield 14B, 14D, 14F is located in the bottom region and arranged in a "W" shape that is intertwined with the second shield 14A, 14C, 14E, 14G that is located in the top region and arranged in a closed "M" shape. The first shield 14B, 14D, 14F is connected to source contacts (S) which may be, but are not required to, located at a triple-points of the first shield. Similarly, the second shield 14A, 14C, 14E, 14G is connected to a source contact(s) (S) located at a triple-point of the second shield, or can also be placed elsewhere on the bottom of "W", basically wherever the "full shields" are available to be contacted.

Figure 2:
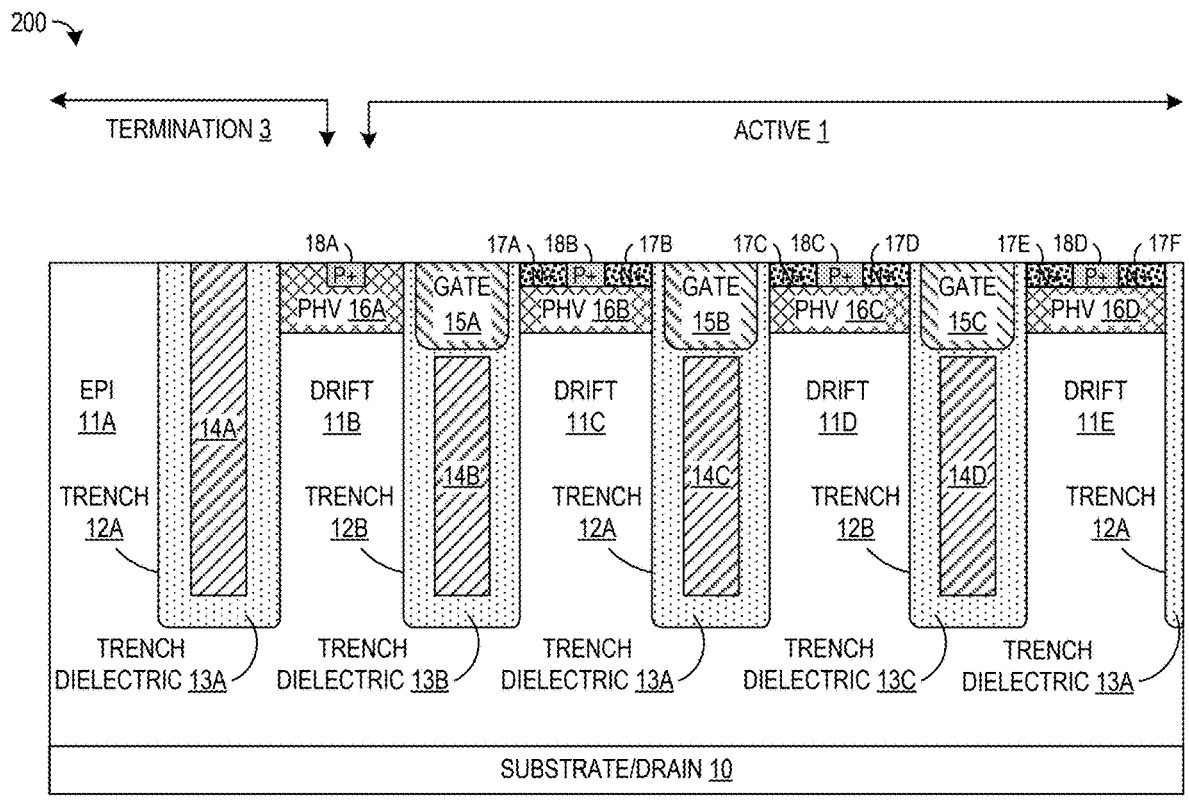
FIG. 2 is a partial cross-sectional view of the active and termination regions of the trench field plate power MOSFET shown in FIG. 1.

As indicated in FIGS. 1-2, narrow body implant regions 16A-F are formed at the semiconductor substrate surface over underlying silicon pillars 11B-G between the trenches 12A, 12B with a serpentine shape. In selected embodiments, the narrow body implant regions 16A-F are formed with p-type high voltage (PHV) regions that are implanted after etching the trenches 12A, 12B in the underlying epitaxial semiconductor layer, thereby extending along the surface of the epitaxial semiconductor layer and enclosed by the first trench 12B. In addition, a narrow P+ region 18A-F is formed in the middle of each narrow body implant region 16A-F, such as by using a patterned mask to selectively implant the indicated P+ regions 18A-F in the p− body implant regions 16A-F.

The depicted layout of the trench field plate power MOSFET device 100 maximizes a radius of the second shield 14A, 14C, 14E, 14G pivoting around the first shield 14B, 14D, 14F (e.g., at the first gate 15A, second gate 15C and third gate 15E), and also a radius of the first shield 14B, 14D, 14F pivoting around the second shield 14A, 14C, 14E, 14G (e.g., at the fourth gate 15B and the fifth gate 15D). In other embodiments, the semicircular portions of the shield are replaced with substantially semicircular portions, while retaining most of the benefit of electric field reduction between the first and second shields, and thus improved voltage breakdown.

Though not shown, an overlying first gate conductor connects to the gates 15A-E through one or more gate contacts (G) for each gate. The number of gate contacts per gate varies between embodiments, depending upon factors such as the width of the first gate conductor and/or desired aggregate contact resistance. In addition, an overlying source conductor (not shown) connects to a plurality of source regions extending parallel to one or both sides of each of the gates 15A-E with a plurality of source contacts (S).

In alignment with the narrow body implant region 16A-F and source contacts (S), a narrow P+ region 18A-F is formed in the middle of each narrow body implant region 16A-F using any suitable selective implantation process. For example, after forming the narrow body implant region 16A-F on the silicon pillars 11B-G, a patterned mask may be formed and used to selectively implant the indicated P+ regions 18A-F in the p– body implant regions 16A-F. And inside the active region 1, N+ source implant regions may be formed in alignment with the narrow body implant region 16B-E and source contacts (S) using any suitable selective implantation process. For example, after forming the narrow body implant regions 16A-F and narrow P+ region 18A-F, a patterned mask may be formed and used to selectively implant the indicated N+ regions 17A-H in the p-body implant regions 16B-E on either side of the narrow P+ region 18B-E.

Referring now to FIG. 2, there is shown a partial cross-sectional view 200 of the active and termination regions of the trench field plate power MOSFET along the line labeled "FIG. 2" shown in FIG. 1. As depicted, a doped substrate 10 forms a drain of the MOSFET, and may be connected to a conductive electrode (not shown) to apply a substrate bias. An epitaxial layer 11 is grown on the substrate 10. For embodiments of an NFET, the substrate 10 is doped with an N++ dopant, and the epitaxial layer 11 has relatively lighter doping with an N– dopant. In some embodiments, the substrate 10 has a <100> lattice orientation.

In the termination area 3, a first trench 12A is formed in the epitaxial layer 11 between the epitaxial pillars 11A, 11B. In the first trench 12a, a first peripheral field plate 14A is formed with polysilicon that is separated from the epitaxial pillars 11A, 11B by a trench dielectric or drift oxide 13A. Inside the active area, one or more additional trenches 12A, 12B are formed in the epitaxial layer 11 between the epitaxial pillars 11B-E. In each active area trench, a field plate (e.g., 14B, 14C, 14D) and gate (e.g., 15A, 15B, 15C) are formed with separate, insulated polysilicon layers such that the field plates (e.g., 14B) are separated from epitaxial drift layers (e.g., 11B, 11C) using the drift oxide (e.g., 13B), and the gate (e.g., 14A) is separated from the underlying field plate (e.g., 14B) using an inter poly dielectric (not separately shown). As depicted, each gate 15A-C is separated from a buried body region 16A-D by sidewall gate oxide portion of the trench dielectric or drift oxide (e.g., 13B, 13A, 13C). In selected embodiments, each buried body region 16A-D is a P– Well or P– Body region, doped with a P– dopant (e.g., Boron). In the active region 1 and termination region 3, each buried body region 16A-F includes a P+ conductor 18A-D is formed to provide a low impedance connection path that is used to connect the field plate shields and source regions via the source contacts (S). And in the active region 1, each buried body region 16B-E also includes isolated by N+ regions 17A-H formed on each side of a corresponding P+ conductor 18B-E. In this arrangement, each gate (e.g., 15B) forms a conduction channel in the buried body region (e.g., 16B) between the drain (e.g., substrate 10), and the N+ source region (e.g., 17B), thereby forming a MOSFET. As will be appreciated, the trench dielectric or drift oxide layers 13A-C may have different thicknesses at different depths, depending on the shape of the buried gates 15A-C and field plates 14A-D. In addition, the specific position, shape, and contour of the buried gates 15A-C and field plates 14A-D will depend on the deposition, mask, and etch sequence used to fabricate these elements.

Through experimental observation, it is seen that trench field plate power MOSFET devices 100 often have destructive failures at very low current levels (e.g., approximately 4-5 A). As shown in FIG. 1, these destructive failures are located in the weak region 2 which is a very small area of the termination region where the peripheral silicon pillar or finger 11B is formed under the peripheral narrow body implant region 16A and P+ region. And as explained more fully hereinbelow, these failures result from avalanche hotspots that arise from the geometric constraints of the termination regions.

Figure 3:
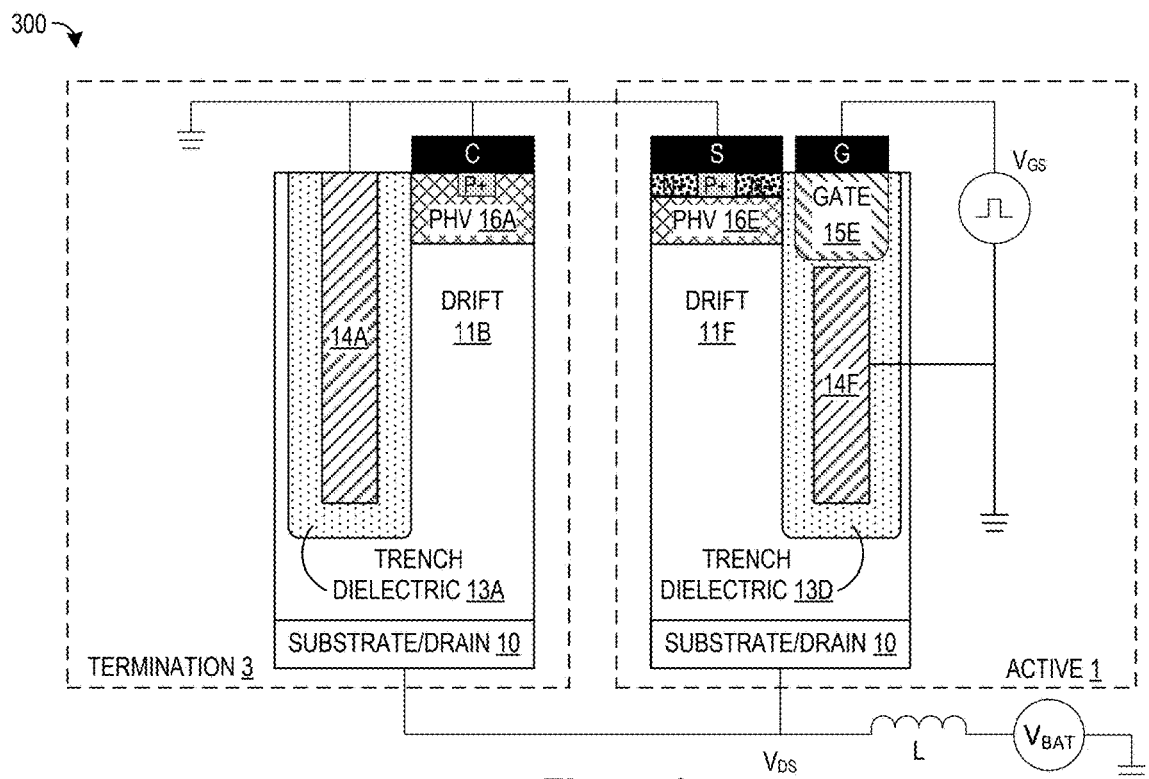
FIG. 3 schematically depicts the active and termination regions of a conventional trench field plate MOSFET during unclamped inductive switching.

To provide additional details for an improved contextual understanding of the present disclosure, reference is now made to FIG. 3 which schematically depicts a conventional trench field plate MOSFET 300 wherein the active and termination regions are connected in an unclamped inductive switching (UIS) arrangement. As depicted, the field plates 14A, 14F in the termination region 3 and active region 1 are both connected to a ground reference potential which is also connected to the peripheral narrow body implant region 16A in the termination region 3 (via contact C) and the narrow body implant region 16E in the active region 1 (via contact S). In the active region 1, a switching gate voltage $V_{GS}$ is applied across the gate 15E and the N+ source (which is connected to the field plate 14F) to turn ON the MOSFET channel so that the drain current $I_D$ starts to build up with time through the inductance L and energy starts to build up in the inductance coil (it is not a parasitic inductance). When the $V_{GS}$ pulse goes back to zero again, the MOSFET turns OFF. However, due to the nature of the inductance, the current cannot immediately reduce to zero. As a result, a high voltage can appear at the drain which forces the MOSFET to enter avalanche and flow the current. The current continues to flow in avalanche until the energy stored in the inductance is dissipated. Beyond this, the MOSFET completely switches OFF and the inductance is no longer energized. During this turn off phase, either or both active and termination regions can enter avalanche, depending on the breakdown voltage of each. In general, both termination and active regions are actively conducting avalanche current, with different magnitudes. The avalanche current during the off-state is thus shared between the active region and termination region 3. As the termination occupies only a small fraction of the total device area, termination hotspot induced failures may occur at low overall currents. As most of the applications require a high UIS capability, the termination must be made robust against these hotspot failures.

Figure 4:
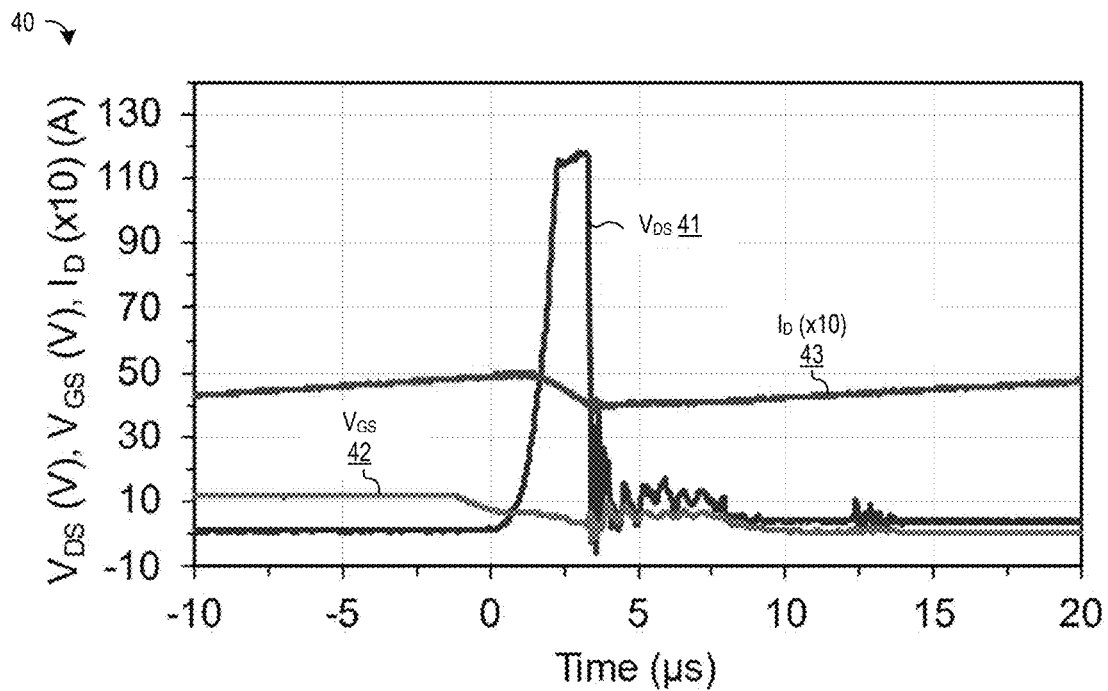
FIG. 4 depicts a UIS waveform at failure with a conventional termination region design.

To understand the root cause of such avalanche hotspots, reference is now made to FIG. 4 which depicts UIS waveforms 40 at failure with a conventional termination region design such as shown in FIGS. 1-2. When UIS tests were applied to 100V class trench field plate power MOSFET devices having an active area of approximately 0.8 mm², all the devices exhibited destructive failures at very low current levels. For example, with the depicted UIS waveform 40 plotted over time to show the drain-source voltage $V_{DS}$ 41, switching gate voltage $V_{GS}$ 42, and drain current $I_D$ 43, it can be seen that destructive failures occur at approximately 4-5 A, which correspond to a current density of approximately 5-6 A/mm². The mode of failure suggests that the destruction is electrical in nature and triggered by high voltage-high current condition, and does not involve a thermal failure involving large area heating.

As will be understood by persons skilled in the art, such failures could be associated with a parasitic bipolar junction transistor (BJT), the onset of an NDR branch in a localized region, the change in RESURF due to field plate acquiring a bias during the transient. However, the fact that the device failures are located in the weak region 2 establishes that the termination region is actively involved in the failure mechanism. In particular, since the termination region is essentially a diode, any parasitic BJT-related failure mechanisms could be ruled out. Moreover, the effects of transient biasing of the field plate could also be discarded since slowing the voltage switching rate dV/dt of the switching gate voltage $V_{GS}$ resulted in an insignificant change in the current capability. As a result, the most plausible mechanism for the observed failures is the onset of instabilities (kinks and NDR branches) in the termination diode characteristics.

Figure 5:
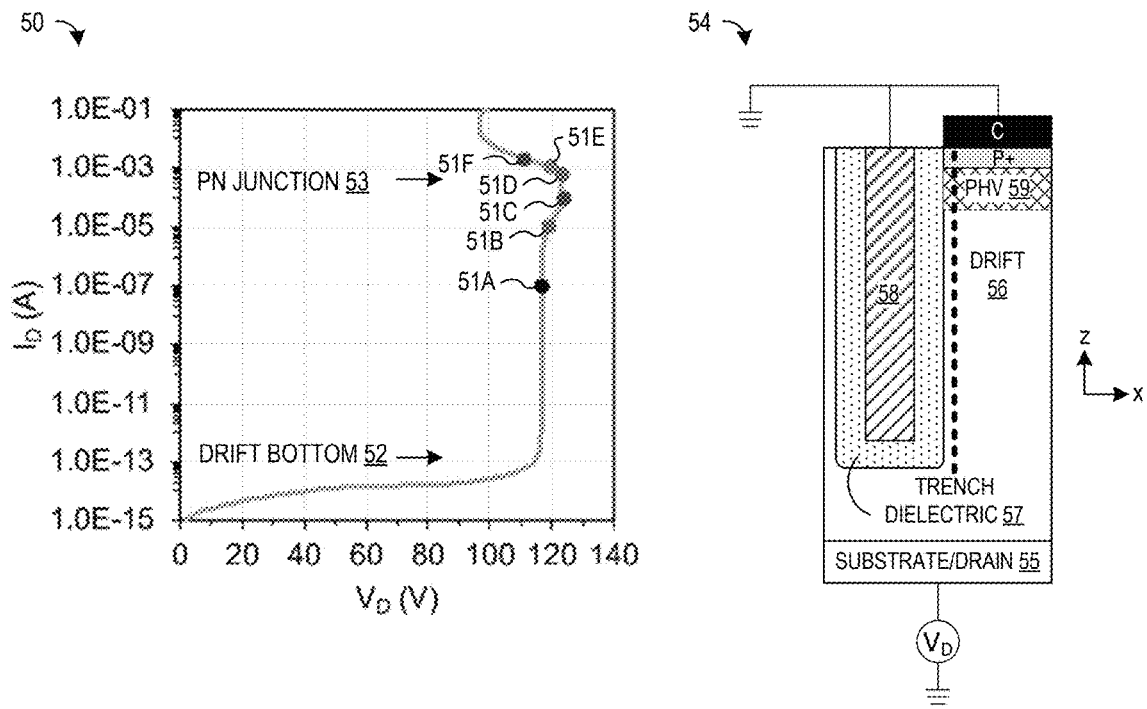
FIG. 5 depicts simulated I-V characteristics and cross-sectional view of a termination region in a conventional trench field plate MOSFET which acts as a diode structure.

To understand the nature of NDR branches, reference is now made to FIG. 5 which depicts simulated I-V characteristics 50 of a termination region in a conventional trench field plate MOSFET which is shown in the cross-sectional view 54 to include a substrate 55 and epitaxial drift region 56 in which a trench dielectric 57 and field plate 58 are formed adjacent to a PHV body region 59 and P+ region. As shown, the termination region does not include a gate or N+ source region, and therefore is simply a trench field plate diode formed between the n-type drift region 56 and PHV region 59 and biased by the supply voltage $V_D$ (at the substrate/drain 55) and the ground reference voltage (connected to the field plate 58 and PHV body region 59 and P+ region). The depicted I-V profile 51 shows that a breakdown at approximately 120V which starts at the bottom of the shielded drift region 52. As current increases, there is a small positive differential resistance (PDR) branch followed by a significant negative differential resistance (NDR) branch emerging. In particular, low drain current values ($I_D$<1.0E-07 A) show no dependence on the drain voltage $V_D$. At node 51B, the behavior changes into a slight positive differential resistance (PDR) branch (nodes 51B-51C), followed by a kink or weak negative differential resistance (NDR) up to the current level of ~6E-4 A (nodes 51C-51D) and then a strong NDR branch beginning at the current level of ~6E-4 A (nodes 51D-51F and beyond).

Figure 6:
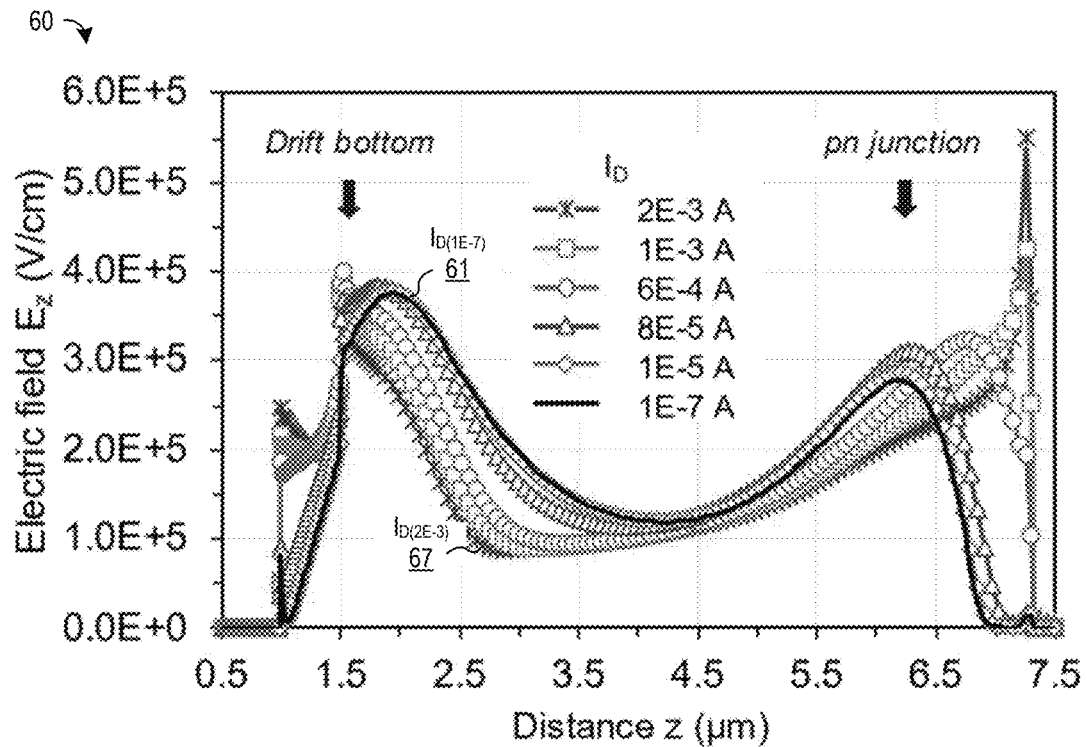
FIG. 6 depicts the longitudinal electric field profiles along the trench sidewall of a conventional trench field plate MOSFET at different current levels.

To further illustrate the electric field modulation profiles resulting from different current flows, reference is now made to FIG. 6 which depicts the longitudinal electric field profiles 60 along the trench sidewall of a conventional trench field plate MOSFET at different current levels along the trench sidewall (as shown in FIG. 5). At low drain current levels (e.g., 1.0E-7 A), the breakdown starts at the bottom sidewall of the trench (Drift Bottom), as shown with the $I_{D(1E-7)}$ signal 61. However, as the current increases, the electric field profile is modified by the carriers in transit. In this case, a high hole current density flows vertically upwards along the trench sidewall. For an adequate current (around 8E-5 A in this case), the electric field peak close to the PN junction can become sufficient to start double injection. This is followed by a kink or an NDR in the I-V characteristics. At higher current levels, there are secondary PDR and NDR branches. The precise behavior of these branches depends on the profiles of doping in the drift and body regions. Designs with heavier body and drift doping can restrict the expansion of the electric field profile and can enable an easier onset of double injection.

In order to prevent hotspot formation in the termination region, the breakdown voltage of the termination could be increased, but such a change is not always feasible and usually requires additional process steps, under-designing the device, or creating a new termination design that would cause a significant departure from the existing fabrication flows. Alternatively, hotspot formation can be prevented by suppressing the double injection and delaying the onset of NDR branches. However, this requires containment of growth of electric field close to the PN junction to prevent increasing avalanche current. While this could be achieved by including buffer layers which spread the electric field and delay the onset of double injection, such changes must be selectively applied to the termination region so that they do not cause an undesirable increase in the on-resistance of the active regions.

As seen from the foregoing, the exact nature of the avalanche current flow in trench field plate MOSFET devices is intricate and depends on several factors, including the differences in breakdown voltage and heat extraction between different regions of the device. As a result, the avalanche current can move between different regions of the device. During this movement, if the current encounters an NDR branch locally, such as in the termination region, it could result in focalization (hotspot formation) and catastrophic failure. Since breakdown voltage is highly sensitive to variations, RESURF-based devices could be more vulnerable to such failures.

Figure 7:
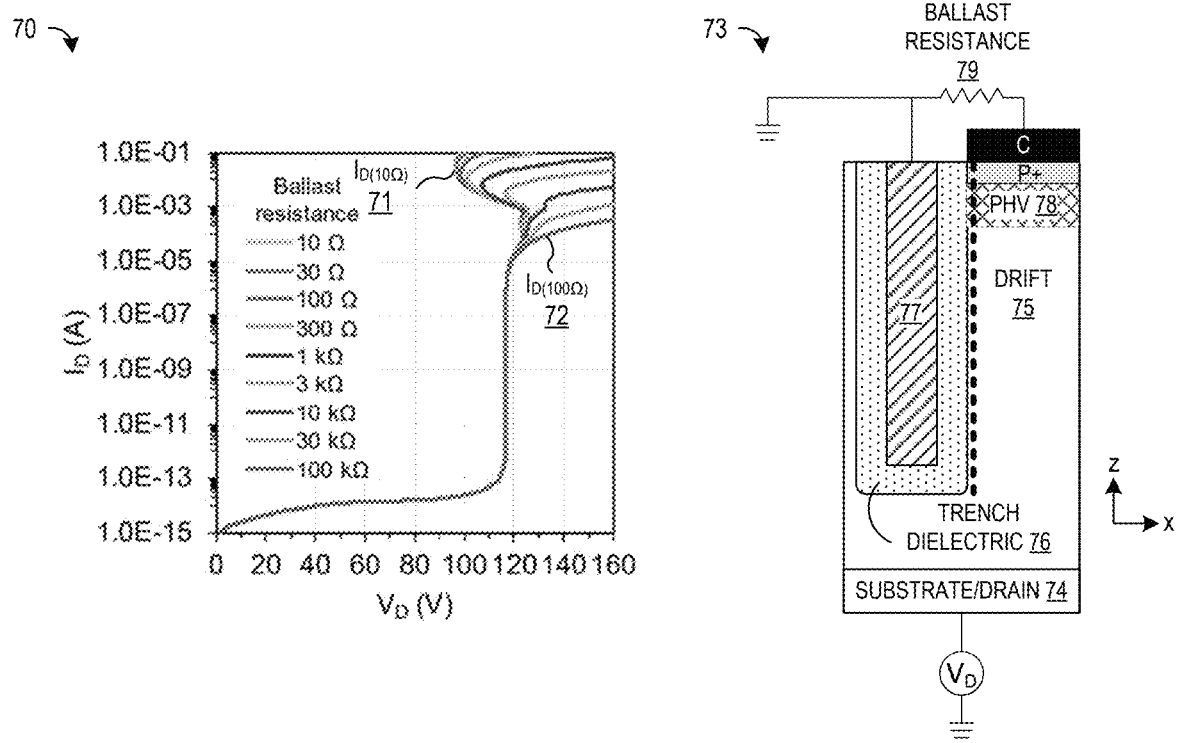
FIG. 7 shows simulated I-V characteristics of a trench field plate MOSFET diode structure with different body ballast resistance values.

To provide additional details for an improved contextual understanding of the present disclosure, reference is now made to FIG. 7 which depicts simulated I-V characteristics 70 of a termination region in a trench field plate MOSFET which is shown in the cross-sectional view 73 to include a substrate 74 and epitaxial drift region 75 in which a trench dielectric 76 and field plate 77 are formed adjacent to a PHV body region 78 and P+ region, where a ballast resistance element 79 is connected between the P+ region/PHV body region 78 and the grounded field plate 77. Without a gate or N+ source region, the termination region functions as a trench field plate diode formed between the n-type drift region 75 and PHV region 78 and biased by the supply voltage $V_D$ (at the substrate/drain 74) and the ground reference voltage (connected to the field plate 77). However, the connection of the ballast resistance element 79 between the field plate 77 and the P+ region/PHV body region 78 enables a controlled bias voltage to be applied to PHV body region 78 of the trench field plate diode based on the voltage developed across the ballast resistance element 79. As seen from the drain current/voltage profiles 70, positive body bias at the PHV region 78 generated by larger ballast resistance values effectively delays the onset of double injection to higher drain voltages, as seen by comparing the $I_{D(10\Omega)}$ signal 71 to the $I_{D(100\Omega)}$ signal 72. It is also noted that a positive body bias on the PHV region 78 does not affect the low current avalanche behavior. While the positive body bias significantly suppresses the PN junction electric field peak at low currents, the field profile becomes almost independent of the body bias at high current. As the background drift doping is compensated by the transiting carriers, it appears that the electric field profile in this regime becomes current-controlled. Owing to this, the potential difference between the drain and body is almost independent of body bias, and a positive body bias results in an equal positive offset in the drain voltage. Such an offset in the drain voltage can provide a negative feedback to current focalization and prevent avalanche hotspot related failures.

Inspired by the role of a positive body bias in delaying the double injection and NDR onset, there is disclosed herein a high voltage vertical field effect transistor device and associated fabrication process for providing improved voltage breakdown characteristics with avalanche hotspot mitigation by integrating termination ballast resistance between vulnerable regions and a nearby contact of the transistor device. By integrating the ballast resistance element into the body current path of the termination region, the avalanche current itself produces the required positive bias on the PHV body region. And by using an adequate resistance, the NDR branches can be completely eliminated in the relevant voltage range.

When the termination layout introduces only localized weak regions prone to hotspot formation, this ballasting scheme can be efficiently into existing trench field plate structures without any process complexity by forming the ballast resistance elements in the epitaxial semiconductor pillars in which the trenches are formed and enclosed. In selected embodiments, the ballast resistance elements may be formed by implanting PHV regions into the epitaxial semiconductor pillars since the sheet resistances of implanted regions can be quite high. For example, the body implant can be of the order of several kOhms/sq and can itself be used to serve as the ballast resistance, provided that the weak regions do not have any implanted P+ regions and are spaced sufficiently far away from the nearest current collecting contact. The removal of the implanted P+ regions not only helps in increasing the ballast resistance, but also allows the electric field profile to spread further at high currents, thereby delaying double injection. As will be appreciated, a lightly doped and long p-type body region can provide a positive self-bias in either the Ohmic regime or in a space-charge controlled regime. In either case, the onset of NDR branches can be very effectively delayed. For large area devices, negligible area in the layout is sacrificed for the inclusion of this ballast resistance. Furthermore, no additional process complexity is introduced in this design, thus making it an attractive choice to mitigate avalanche hotspots in the termination.

Figure 8:
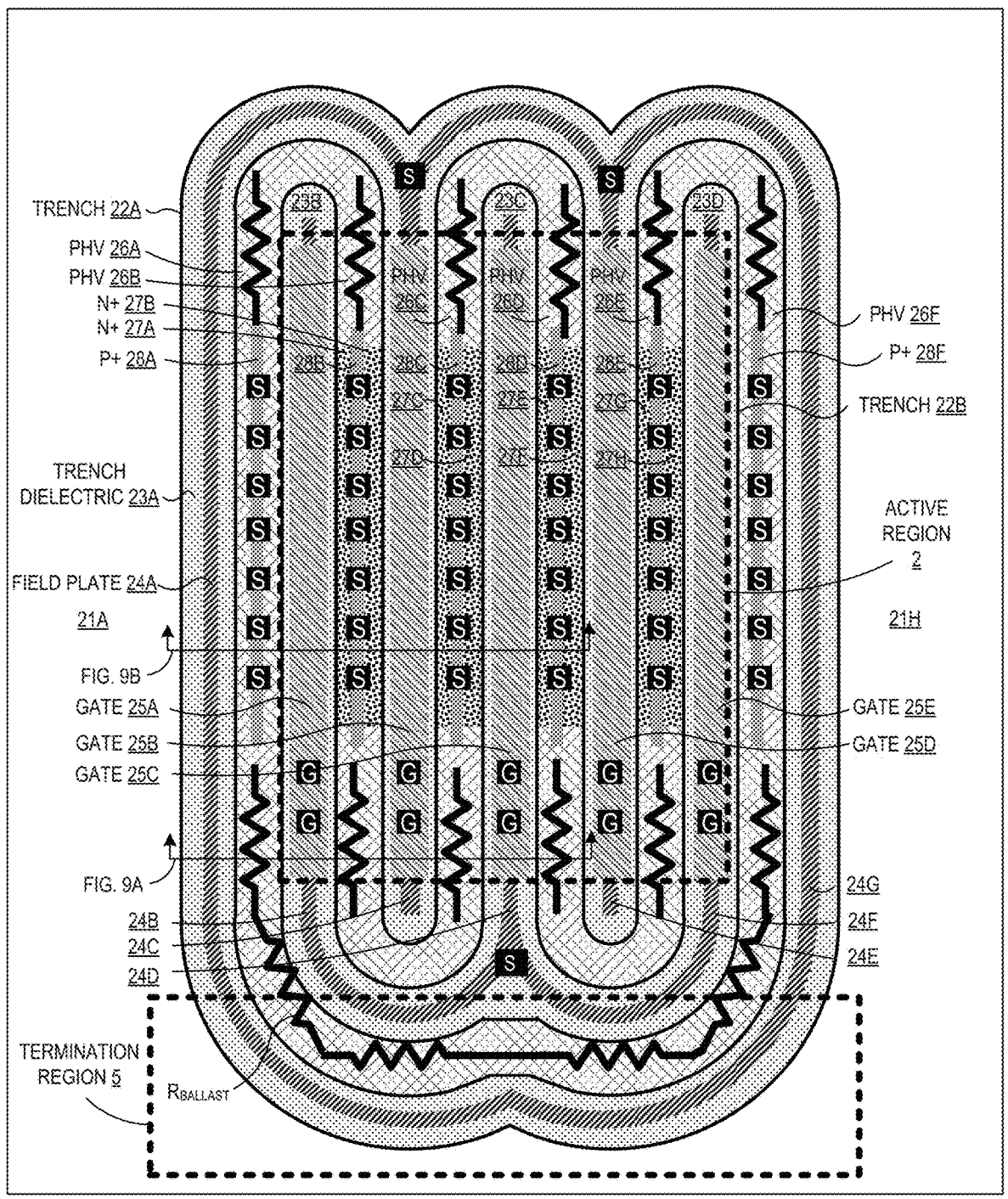
FIG. 8 is a plan view of a trench field plate power MOSFET with integrated termination ballast resistance in accordance with selected embodiments of the present disclosure.

To address these limitations from conventional solutions and others known to those skilled in the art, reference is now made to FIG. 8 which is a plan view of a trench field plate power MOSFET 800 with integrated termination ballast resistance elements $R_{BALLAST}$ for mitigating avalanche hotspots in accordance with selected embodiments of the present disclosure. As with the case of FIG. 1, the following description is provided with reference to an n-channel FET (NFET) embodiment, but it will be appreciated that a p-channel FET (PFET) embodiment may also be used in which case the doping polarities of the PFET are reversed from the NFET.

Similar to the arrangement in FIG. 1, the device 800 includes a first gate 25A, a second gate 25C, and a third gate 25E arranged in parallel with a fourth gate 25B (interposed between the first gate 25A and the second gate 25C) and a fifth gate 25D (interposed between the second gate 25C and the third gate 25E). In addition, a first shield 24B, 24D, 24F is formed with a deposited and buried polysilicon layer in a first trench 22B so that the first, second, and third gates 25A, 25C, 25E are formed with a second polysilicon layer deposited over the first shield 24B, 24D, 24F with dielectric isolation. In the depicted device 800, the first shield 24B, 24D, 24F forms a continuous conduction path connecting the partial shields underlying the first, second, and third gates 25A, 25C, 25E. Similarly, a second shield 24A, 24C, 24E, 24G in a second trench 22A forms a continuous conduction path connecting the partial shields underlying the fourth and fifth gates 25B, gate 25D. As a result, the second shield 24A, 24C, 24E, 24G further encircles the five gates 25A-E to form a continuous shield around the interactive area including the gates.

The depicted device 800 also includes narrow body implant regions 26A-F formed at the semiconductor substrate surface over underlying epitaxial semiconductor pillars 21B-G between the trenches 22A, 22B with a serpentine shape. In selected embodiments, the narrow body implant regions 26A-F are formed by using a patterned implant mask to selectively implant p-type high voltage (PHV) regions after etching the trenches 22A, 22B in the underlying epitaxial semiconductor layer 21, thereby extending along the surface of the epitaxial semiconductor layer 21 between the trenches 22A, 22B. In the depicted layout of the trench field plate power MOSFET device 800, the PHV body implant regions 26A-F are formed between the trenches 12A, 12B as implants in the underlying epitaxial semiconductor pillars 21B-G to define a single, continuous serpentine shape that encircles and separates the gates 25A-E from one another, thereby providing a body channel region for the trench field plate power MOSFET 800.

In upper portions of the narrow body implant regions 26A-F, N+ source regions 27A-27H may be selectively implanted to form n-type source regions between the gates 25A-E in the active region 2. In selected embodiments, the N+ source regions 27A-27H are formed by using a patterned implant mask to selectively implant N+ source regions in an upper portion of narrow body implant regions 26A-F. In addition, P+ regions 28A-F may be selectively implanted in upper portions of the narrow body implant regions 26A-F to form source contacts adjacent to portions of the gate electrodes 25A-E in the active region where the source contacts (S) are located. In this way, the P+ regions provide a low impedance connection to connect source regions, such as along the source contacts (S) adjacent to each gate electrodes 25A-E. However, the P+ regions 28A-F are not formed outside of the desired source contact regions, thereby creating ballast resistance elements $R_{BALLAST}$ in termination region areas 5 outside of the active region 2 where weak or vulnerable termination regions may be located. In the example device 800, the integrated ballast resistance elements $R_{BALLAST}$ at the bottom termination region is effective in preventing avalanche hotspots in silicon drift regions in the weak termination areas. While the upper termination region may not benefit from including an integrated ballast resistance elements $R_{BALLAST}$ due to their configuration and shape, there may be design scenarios where upper termination region becomes prone to hotspots, in which case it will be beneficial to remove the P+ implant regions from the PHV body implant regions 26 in this upper region.

As disclosed herein, the selective formation of the integrated ballast resistance elements $R_{BALLAST}$ may be controlled by using a suitable patterned mask to selectively implant the indicated P+ regions 28A-F to be located in the p-body implant regions 26A-F only adjacent to the gate electrodes 25A-E, but not in the upper and/or lower semicircular portions of the PHV body implant regions 26A-F. In the depicted layout of the trench field plate power MOSFET device 800, the P+ regions are not implanted in the semicircular portions of the PHV body implant regions 26A-F, but are only formed adjacent to portions of the gate electrodes 25A-E in the active region where the source contacts (S) are located. In addition, source contacts (S) are formed in alignment to contact the P+ regions 26A-F, and include termination region source contacts formed on the body well regions 26A, 26F adjacent to an outer side of the outer gates 25A, 25E which contact the P+ regions 28A, 28F, and also include active region source contacts formed on the body well regions 26B-E between the gates 25A-E which contact the N+ regions 27A-H and P+ regions 28B-E.

Figure 9A:
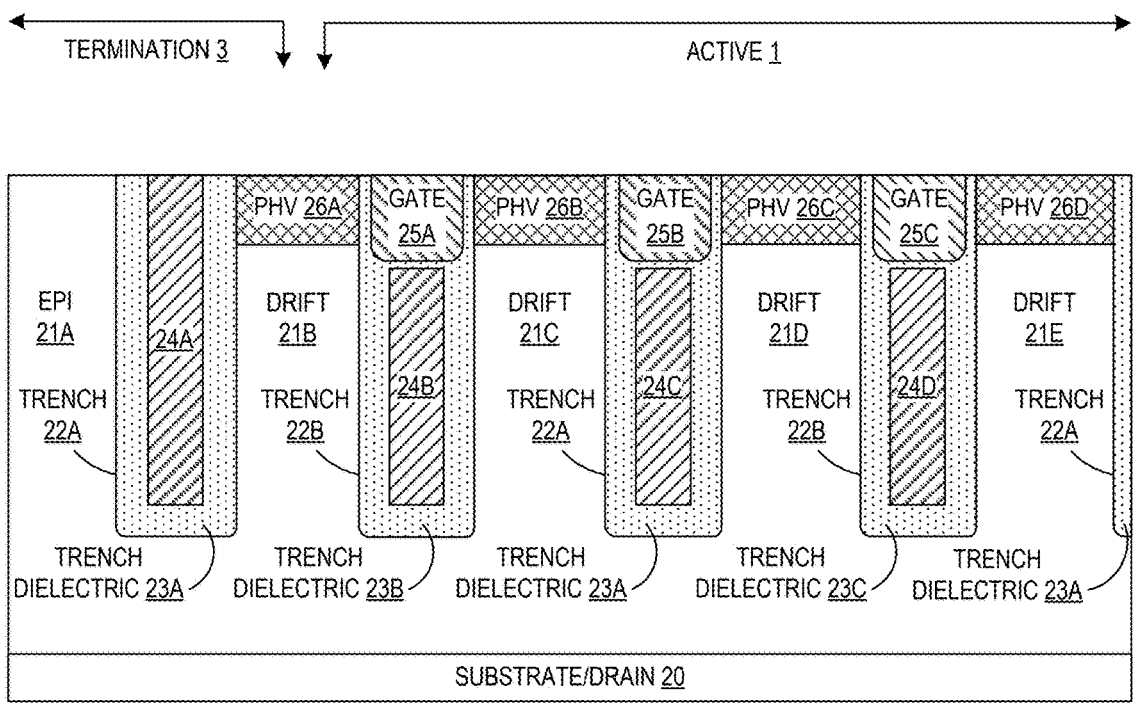
FIG. 9A is a first partial cross-sectional view of the trench field plate MOSFET shown in FIG. 8 in accordance with selected embodiments of the present disclosure.

For an improved understanding of selected embodiments of the present disclosure, reference is now made to FIG. 9A which depicts a first partial cross-sectional view 900A of the trench field plate MOSFET along the line labeled "FIG. 9A" shown in FIG. 8. In this cross-sectional view, the ballast resistance element is formed in the depicted PHV body implant regions 26A-F where implanted P+ regions are not formed. As depicted, a doped substrate 20 forms a drain of the MOSFET, and may be connected to a conductive electrode (not shown) to apply a substrate bias. On the substrate 20, an epitaxial semiconductor layer 21 is formed and subsequently etched to form epitaxial drift regions 21A-E as semiconductor pillar structures. For NFET embodiments, the substrate 20 is doped with an N++ dopant, and the epitaxial layer 21 has relatively lighter doping with an N− dopant. In some embodiments, the substrate 10 has a <100> lattice orientation.

In the termination area 3, a first trench 22A is formed in the epitaxial layer 21 between the epitaxial pillars 21A, 21B. In the first trench 22a, a first peripheral field plate 24A is formed with polysilicon that is separated from the epitaxial pillars 21A, 21B by a trench dielectric or drift oxide 13A. Inside the active area, one or more additional trenches 22A, 22B are formed in the epitaxial layer 21 between the epitaxial pillars 21B-E. In each active area trench, a field plate (e.g., 24B, 24C, 24D) and gate (e.g., 25A, 25B, 25C) are formed with separate polysilicon layers that are separated from one another and the adjacent epitaxial pillars 21B-E by a trench dielectric or drift oxide (e.g., 23B, 23A, 23C) as shown. As depicted, each gate 25A-C is separated from a buried PHV body region 26A-D by sidewall gate oxide portion of the trench dielectric or drift oxide (e.g., 23B, 23A, 23C). In selected embodiments, each buried PHV body region 26A-D is a P-Well or P-Body region, doped with a P− dopant (e.g., Boron). In the active region 1 and termination region 3, each buried PHV body region 26A-F does not include a P+ conductor region, thereby providing a high sheet resistance region that effectively integrates a ballast resistor element to help induce a positive body bias at the termination region.

Figure 9B:
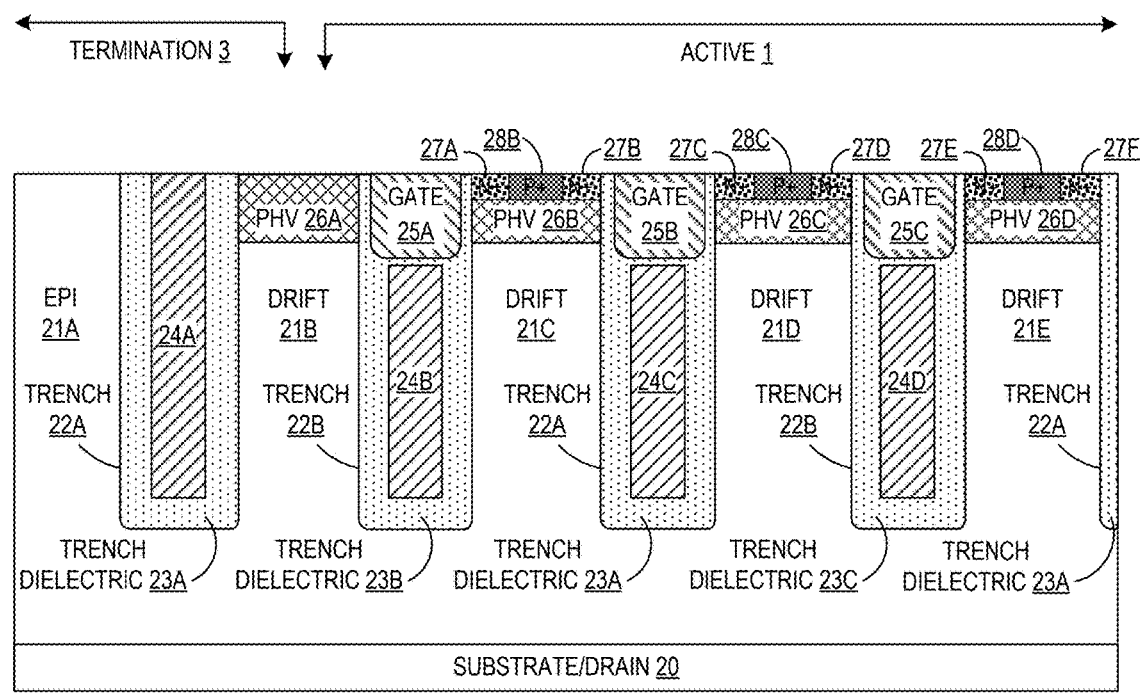
FIG. 9B is a second partial cross-sectional view of the trench field plate MOSFET shown in FIG. 8 in accordance with selected embodiments of the present disclosure.

For an improved understanding of selected embodiments of the present disclosure, reference is now made to FIG. 9B which depicts a second partial cross-sectional view 900B of the trench field plate MOSFET along the line labeled "FIG. 9B" shown in FIG. 8. In this cross-sectional view, the ballast resistance element is formed in the depicted PHV body implant region 26A of the termination region 3 where a P+ region is not formed, but not in the remaining PHV body implant regions 26B-D of the active region 1 where the P+ regions 27A-F and N+ regions 28B-D are formed.

In the termination area 3, a first trench 22A is formed in the epitaxial layer 21 between the epitaxial pillars 21A, 21B. In the first trench 22a, a first peripheral field plate 24A is formed with polysilicon that is separated from the epitaxial pillars 21A, 21B by a trench dielectric or drift oxide 13A. Inside the active area, one or more additional trenches 22A, 22B are formed in the epitaxial layer 21 between the epitaxial pillars 21B-E. In each active area trench, a field plate (e.g., 24B, 24C, 24D) and gate (e.g., 25A, 25B, 25C) are formed with separate polysilicon layers that are separated from one another and the adjacent epitaxial pillars 21B-E by a trench dielectric or drift oxide (e.g., 23B, 23A, 23C) as shown. As depicted, each gate 25A-C is separated from a buried PHV body region 26A-D by sidewall gate oxide portion of the trench dielectric or drift oxide (e.g., 23B, 23A, 23C). In selected embodiments, each buried PHV body region 26A-D is a P-Well or P-Body region, doped with a P− dopant (e.g., Boron). In the active region 1 and termination region 3, each buried PHV body region 26A-F does not include a P+ conductor region, thereby providing a high sheet resistance region that effectively integrates a ballast resistor element to help induce a positive body bias at the termination region.

While FIG. 8 shows that the P+ implant regions 28A-F are formed with conductor lines having the same length, it will be appreciated that the length of P+ conductor lines 28A, 28F in the termination region 3 may be different than in the active region 1, depending on the design and requirements. FIG. 8 also shows that the P+ implant regions 28A-F are each connected to the same number of source contacts (S), but it will be appreciated that the number of source contacts in the termination region 3 may differ from the number of P+ source contacts in the active region 1. For example, the P+ implant regions 28A, 28F in the termination region 3 may be connected to only 2 source contacts using a short P+ line, while the P+ implant regions 28B-E in the active region 1 may be connected to 7 source contacts using longer P+ lines.

As will be appreciated, the benefits of integrating a ballast resistance element can be achieved with a variety of different device layouts and designs of vertical channel MOSFET devices described herein. For example, if the buried PHV body region does not have sufficient length between the vulnerable region and the nearest "non-vulnerable" contact to generate the required amount of ballast resistance, then the resistance may be adjusted using any suitable technique to provide the required ballast resistance to suppress the NDR. One way to adjust the resistance of the buried PHV body in the termination region would be to implant impurities or dopants to increase the sheet resistance of the buried PHV body region in the termination region. For example, sheet resistance can be increased by doping with n-type impurities which would partially compensate the p-type PHV and increase the resistance. Alternatively, a lighter PHV type implant could be used in the termination are while using the required PHV implant in the active regions of the device. Either of these alternatives adds a process step to the fabrication sequence. Another option for adjusting the resistance of the buried PHV body in the termination region is to extend the length of the buried PHV body region used to provide the required ballast resistance to suppress the NDR.

Figure 10:
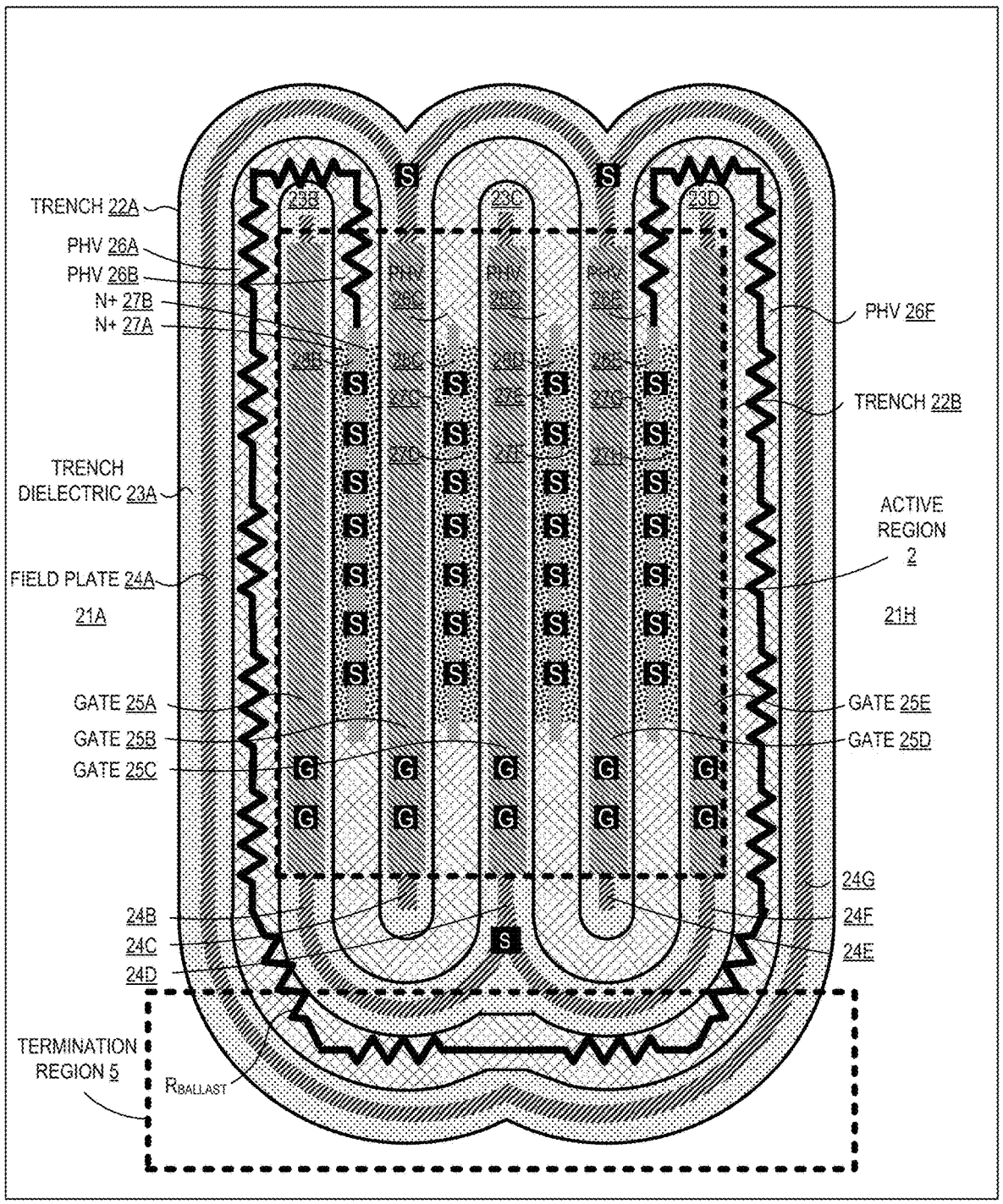
FIG. 10 shows a plan view of a trench field plate MOSFET with integrated termination ballast resistance in accordance with a selected alternative embodiments of the present disclosure.

Yet another way to generate sufficient termination ballast resistance is to elongate or extend the length of the buried PHV region between the vulnerable region and the nearest "non-vulnerable" contact. To illustrate this approach, reference is now made to FIG. 10 which shows a plan view of a trench field plate MOSFET 1000 with an integrated termination ballast resistance elements $R_{BALLAST}$ for mitigating avalanche hotspots in accordance with selected embodiments of the present disclosure. As with the case of FIG. 8, this example is described with reference to an n-channel FET (NFET) embodiment, but it will be appreciated that a p-channel FET (PFET) embodiment may also be used in which case the doping polarities of the PFET are reversed from the NFET.

Similar to the arrangement in FIG. 8, the device 1000 includes a first gate 25A, a second gate 25C, and a third gate 25E arranged in parallel with a fourth gate 25B (interposed between the first gate 25A and the second gate 25C) and a fifth gate 25D (interposed between the second gate 25C and the third gate 25E). In addition, a first shield 24B, 24D, 24F is formed with a deposited and buried polysilicon layer in a first trench 22B so that the first, second, and third gates 25A, 25C, 25E are formed with a second polysilicon layer deposited over the first shield 24B, 24D, 24F with dielectric isolation such that the first shield 24B, 24D, 24F forms a continuous conduction path connecting the partial shields underlying the first, second, and third gates 25A, 25C, 25E. Similarly, a second shield 24A, 24C, 24E, 24G in a second trench 22A forms a continuous conduction path connecting the partial shields underlying the fourth and fifth gates 25B, gate 25D. As a result, the second shield 24A, 24C, 24E, 24G further encircles the five gates 25A-E to form a continuous shield around the inter-active area including the gates.

The depicted device 1000 also includes narrow body implant regions 26A-F formed at the semiconductor substrate surface over underlying epitaxial semiconductor pillars 21B-G between the trenches 22A, 22B with a serpentine shape. In selected embodiments, the narrow body implant regions 26A-F are formed by using a patterned implant mask to selectively implant p-type high voltage (PHV) regions after etching the trenches 22A, 22B in the underlying epitaxial semiconductor layer 21, thereby extending along the surface of the epitaxial semiconductor layer 21 between the trenches 22A, 22B. In the depicted layout of the trench field plate power MOSFET device 1000, the PHV body implant regions 26A-F are formed between the trenches 12A, 12B as implants in the underlying epitaxial semiconductor pillars 21B-G to define a single, continuous serpentine shape that encircles and separates the gates 25A-E from one another, thereby providing a body channel region for the trench field plate power MOSFET 1000.

In upper portions of the narrow PHV body implant regions 26B-E located within the active region 2, N+ source regions 27A-27H may be selectively implanted to form n-type source regions between the gates 25A-E in the active region 2. In selected embodiments, the N+ source regions 27A-27H are formed by using a patterned implant mask to selectively implant N+ source regions in an upper portion of narrow body implant regions 26B-E. In addition, P+ regions 28B-E may be selectively implanted in upper portions of the narrow body implant regions 26B-E to form source contacts between the gate electrodes 25A-E in the active region where the source contacts (S) are located. However, in the regions outside of the active area 2, including the termination region 5 and the PHV body implant regions 26A, 26F that are peripherally adjacent to the gates 25A, 25E, there are no implanted P+ regions, thereby extending the length of the lower conductivity/higher resistance PHV body implant regions 26A, 26F between the termination region 5 and the nearest "non-vulnerable" contact (S). In this way, the P+ regions 28B-E in the active area 2 provide a low impedance connection to connect source regions, such as along the source contacts (S) between the gate electrodes 25A-E. However, since there are no P+ regions 28 formed outside of the PHV body implant regions 26A, 26F that are peripherally adjacent to the gates 25A, 25E, the integrated ballast resistance elements $R_{BALLAST}$ formed in the PHV body implant regions 26A, 26F to connect the source contacts (S) to the termination region areas 5 are effectively increased. In the example device 1000, the integrated ballast resistance elements $R_{BALLAST}$ between the bottom termination region 5 and the source contact (S) formed at the top of the P+ region 28B is lengthened and increased to sufficiently increase the positive bias in the PHV body well region 26A to mitigate avalanche hotspots in silicon drift regions 21 in the weak termination areas.

As disclosed herein, the selective formation of the integrated ballast resistance elements $R_{BALLAST}$ may be controlled by using a suitable patterned mask to selectively implant the indicated P+ regions 28B-E to be located in the p-body implant regions 26B-E only between the gate electrodes 25A-E, but not in the upper and/or lower semicircular portions of the PHV body implant regions 26A-F. In the depicted layout of the trench field plate power MOSFET device 1000, the P+ regions are not implanted in the semi-circular portions of the PHV body implant regions 26A-F or peripherally adjacent to the gates 25A, 25E, but are only formed between the gate electrodes 25A-E in the active region where the source contacts (S) are located. In addition, source contacts (S) are formed in alignment to contact the N+ regions 27A-H and P+ regions 26B-E.

Figure 11:
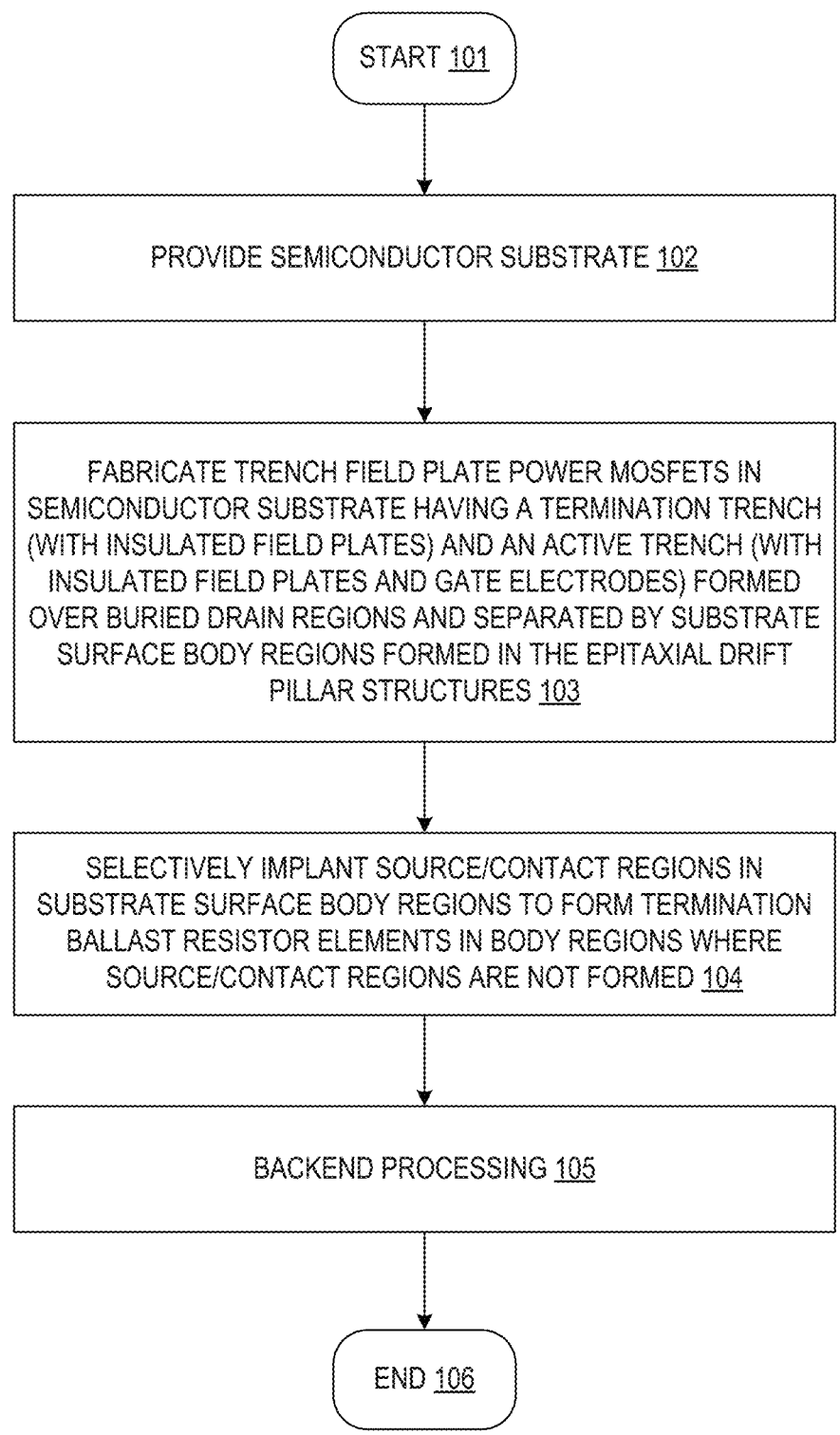
FIG. 11 shows a flowchart depicting a method for fabricating trench field plate MOSFETs with integrated termination ballast resistance in accordance with selected embodiments of the present disclosure.

To further illustrated selected embodiments of the present disclosure, reference is now made to FIG. 11 which is a simplified schematic flow chart 1100 illustrating various methods for fabricating trench field plate MOSFETs with integrated termination ballast resistance. In describing the fabrication methodology 1100, the description is intended merely to facilitate understanding of various exemplary embodiments and not by way of limitation. Unless otherwise indicated, the identified processing steps 101-106 may be implemented with one or more individual fabrications steps, including but not limited to depositing, growing, masking, developing, exposing, patterning, implanting, doping, etching, cleaning, stripping, annealing, and/or polishing that are performed in any desired order. Since the steps illustrated in FIG. 11 and described below are provided by way of example only, it will be appreciated that alternative embodiments of fabrication method 1100 may include additional steps, omit certain steps, substitute or alter certain steps, or perform certain steps in an order different than that illustrated in FIG. 11.

Once the fabrication methodology starts (step 101), a semiconductor substrate is provided at step 102. For example, a semiconductor wafer structure may be provided which is formed with a semiconductor substrate structure having a predetermined crystallographic orientation and thickness (e.g., approximately 0.6 mm). Depending on the type of transistor device being fabricated, the semiconductor substrate structure may be implemented as a bulk silicon substrate, single crystalline silicon (doped or undoped), epitaxial semiconductor material, SOI substrate, or any semiconductor material including, for example, Si, Si C, SiGe, SiGeC, Ge, GaAs, InAs, InP as well as other Group III-V compound semiconductors or any combination thereof, and may optionally be formed as the bulk handling wafer. As will be appreciated, the semiconductor substrate structure may be appropriately doped to provide n-type (electron) and p-type (hole) carriers. On the semiconductor substrate structure, a bottom N++ doped substrate drain layer may be formed to a predetermined thickness (e.g., about 0.0001-0.01 mm) and doping level so as to provide highly doped N++ drain region. Alternatively, at the end of the device fabrication, the wafer is polished down from the back side to desired thickness and a back side metal for drain is deposited. The drain layer may also be formed by epitaxially growing or depositing a semiconductor layer which is implanted or diffused with n-type impurities, such as by controlling the implant dopant, energy and dose so as to provide relatively shallow highly doped N+ drain region by implanting an n-type dopant (e.g., phosphorus or arsenic)

with a peak concentration of approximately 1E20 cm$^{-3}$ or greater at a predetermined depth (e.g., approximately 0.5 micrometers) and a subsequent heat drive step, but other dopants and values may also be used. On the N++ doped substrate drain layer, an n-type epitaxial layer may be formed to a predetermined thickness and doping level so as to provide a generally somewhat less heavily doped N type region. Non-limiting example of epitaxial growth include ultra-high vacuum chemical vapor deposition (UHV-CVD) at low temperature (e.g., around 550° C.), and/or low pressure chemical vapor deposition (LP-CVD) at higher temperature (e.g., around 900° C.) and by other means known in the art. Depending on the type of transistors or other active devices intended to be fabricated, the thickness and doping concentration of the n-type epitaxial layer is controlled to provide the required breakdown voltage and resistance requirements for the trench field plate power MOSFETs. In these and still other embodiments, one or both of the N++ doped substrate drain layer and n-type epitaxial layer may be formed in several stages with or without intermediate doping steps so that the lower substrate drain layer is more heavily doped than the n-type epitaxial layer to reduce Rds(ON) and parasitic resistance.

At step 103, one or more trench field plate power MOSFETs are fabricated in the semiconductor substrate to include termination trenches and active trenches formed over buried drain regions and separated by substrate surface body regions formed over epitaxial drift pillar structures. Using any suitable fabrication sequence, insulated field plates are formed in the termination trench(es) to substantially surround and shield the active region. In addition, insulated field plates and gate electrodes are formed in the active trench(es) that are substantially located in the active region. With reference to the example layout shown in FIGS. 8-9A/B, a termination trench (22A) and active trench (22B) may be etched into the semiconductor layer (21) from an upper major surface of the semiconductor substrate, where the trenches 22A, 22B are separated from one another by epitaxial semiconductor drift pillar structures (21B-G). In sidewalls of the trenches 22A, 22B, one or more trench dielectric or oxide layers (23A-B) are conformally grown or deposited, followed by conformal growth and/or deposition of on the trench sidewalls before depositing one or more electrically conductive layers, such as doped polysilicon, over the semiconductor substrate to fill the trenches before polishing or etching the electrically conductive layer(s) to form termination trench field plates (e.g., 24A, 24G) as well as active trench field plates (e.g., 24B-F) which are subsequently recessed with a selective etch process. For example, after forming an etch mask over the termination trench 24A, 24G, the electrically conductive layer(s) in the active trenches may be partially recessed or etched to form recessed field plates (24B-F) in the active trench 22B, followed by any desired fabrication sequence to form a gate dielectric layer on the exposed active trench sidewalls and recessed field plates and to form the gate electrodes 25A-E on the gate dielectric layer. Either or after forming the field plates 24A-G and gate electrodes 25A-E, substrate surface body regions (26A-F) are formed in the epitaxial semiconductor drift pillar structures (21B-G) which separate the trenches 22A, 22B. In selected embodiments, the substrate surface body regions (26A-F) may be formed by using a patterned implant mask to implant p-type high voltage (PHV) body implant region into a top portion of semiconductor layer 21, resulting in implant regions (26A-F) between trenches 22A, 22B. The present disclosure is not confined to any particular shape or structure for the gate electrodes 25A-E, though it will be appreciated that the sidewall profiles and/or relative position of the gate electrodes 25A-E in relation to the recessed trench field plates (e.g., 24B-F) and/or epitaxial semiconductor drift pillar structures (21B-G) may be controlled to improve voltage breakdown, leakage, and reliability performance.

At step 104, source/contact regions are selectively implanted into portions of the substrate surface body regions and not implanted into other portions of the substrate surface body regions, thereby forming termination ballast resistor elements in the body regions where the source/contact regions are not formed. For example, any suitable patterned mask and implantation sequence may be used to selectively form N+ source implant regions 27A-H in the substrate surface body regions (26B-E) to be adjacent to the gate electrodes 25A-E in the active region 2, but not to otherwise form N+ source implant regions in the termination region 3. In addition, a second patterned mask and implantation sequence may be used to selectively form P+ source contact regions (e.g., 28A-F) in portions of the substrate surface body regions (26A-F) that are adjacent to the gate electrodes 25A-E in the active region 2, but not to otherwise form P+ source implant regions in portions of the substrate surface body regions 26A, 26F which are located in the termination region 3. As disclosed herein, the portions of the substrate surface body regions 26A, 26F which do not include P+ source contact regions 28 effectively incorporate a ballast resistor element $R_{BALLAST}$ which increases the positive body bias in the substrate surface body regions 26A, 26F of the termination region 3.

In embodiments where the outermost portions of the substrate surface body regions 26A, 26F which extend into the termination region 3 do not include sufficient ballast resistance to raise the raise the body bias of the buried PHV body, then the ballast resistance may be adjusted using a variety of different techniques to provide the required ballast resistance to suppress the NDR. One way to adjust the resistance of the buried PHV body in the termination region is to implant impurities or dopants increase the sheet resistance of the buried PHV body region in the termination region. This can be achieved by using a patterned implant mask which exposes the portions of the outermost portions of the substrate surface body regions 26A, 26F, and then implanting suitable impurities (e.g., n-type dopants or neutral dopants) to adjust the resistance of the implanted portions of the substrate surface body regions 26A, 26F. Another option for adjusting the resistance of the buried PHV body in the termination region is to extend the length of the buried PHV body region used to provide the required ballast resistance to suppress the NDR. In this option, the layout is adjusted so that source contacts (S) are not included in the outermost portions of the substrate surface body regions 26A, 26F which extend into the termination region 3, and by defining patterned implant masks which prevent P+ source implant regions form being formed in the outermost portions of the substrate surface body regions 26A, 26F which extend into the termination region 3. In case there is still not enough length of PHV, the entire device structure can be elongated which would increase the area of the chip devoted to the termination, but would still address the hotspot issue.

At step 105, implanting and backend processing are performed before the fabrication methodology ends at step 106. Such backend processing may include forming one or more source/body metal conductor layers to connect the self-aligned N+ source and P+ body contact regions. In addition, additional fabrication steps are performed to fabricate and connect the vertical trench FET structures described herein, such as forming a contact to the bottom drain region, gate electrodes, and source/body contacts. In addition, thermal treatments for the implanted regions are applied at some point in the fabrication sequence to activate the implanted regions and otherwise repair implantation damage. In addition, other circuit features may be formed on the wafer structure, such as transistor devices, using one or more of sacrificial oxide formation, stripping, isolation region formation, well region formation, gate dielectric and electrode formation, extension implant, halo implant, spacer formation, source/drain implant, heat drive or anneal steps, and polishing steps, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

Accordingly, the fabrication method 1100 provides the overall process flow sequence for making high voltage vertical field effect transistor devices with improved voltage breakdown characteristics to mitigate avalanche hotspots by integrating termination ballast resistance between vulnerable regions and a nearby contact of the transistor device. It should be understood that certain steps in the process flow sequence 1100 may be performed in parallel with each other or with performing other processes. In addition, the particular ordering of the process flow sequence 1100 may be modified, while achieving substantially the same result. Accordingly, such modifications are intended to be included within the scope of the inventive subject matter.

By now it should be appreciated that there is provided herein a high power trench field plate power MOSFET device and associated method for fabricating same. The disclosed power MOSFET device includes a semiconductor substrate structure having a first (top) surface and a second (bottom) surface. In addition, the power MOSFET device includes first and second trenches formed in the first surface of the semiconductor substrate structure and separated from one another by a narrow epitaxial semiconductor drift pillar structure which uniformly separates the first and second trenches and which extends down from the first surface of the semiconductor substrate structure. In selected embodiments, the semiconductor substrate structure includes a heavily doped n-type semiconductor substrate layer and a lightly doped n-type epitaxial semiconductor layer in which the first and second trenches are formed to define the narrow epitaxial semiconductor drift pillar structure. In other embodiments, the first trench is arrayed on the first surface of the semiconductor substrate structure to surround the second trench, to extend into the termination area, and to substantially align with a subset of the plurality of insulated gate electrode layers in the active area. In such embodiments, the second trench may include a first plurality of parallel trench openings formed in the first surface of the semiconductor substrate structure and connected together on one end with a connecting trench opening. In addition, the first trench may include a second plurality of parallel trench openings formed in the first surface of the semiconductor substrate structure to be interspersed with the first plurality of parallel trench openings and connected together on both ends with connecting trench openings to surround the second trench. The power MOSFET device also includes a plurality of insulated gate electrode layers formed in upper portions of the first and second trenches to define (1) an active area which includes the plurality of insulated gate electrode layers, and (2) a termination area outside of the active area. In an upper portion of the first trench that is located outside of the active area, a first insulated field plate layer is formed. And in a portion of the second trench that is located inside the active area, a second insulated field plate layer is formed, where the second insulated field plate layer is located below the plurality of insulated gate electrode layers in the active area. In addition, the disclosed power MOSFET device includes a body well region formed in an upper portion of the narrow epitaxial semiconductor drift pillar structure. In selected embodiments, the body well region may be a p-type high voltage (PHV) implant well region formed in the narrow epitaxial semiconductor drift pillar structure to uniformly separate the first and second trenches in the active and termination areas. As formed, the body well region includes a plurality of source contact regions adjacent to the plurality of insulated gate electrode layers, and an integrated ballast resistor section which connects one or more of the plurality of source contact regions to the termination area and which has no source contact regions. In such embodiments, the plurality of source contact regions may include a plurality of N+ source implant regions formed in the PHV implant well region between the plurality of insulated gate electrode layers and within the active area; and a plurality of P+ implant regions formed in the PHV implant well region in alignment with the plurality of N+ source implant regions but not extending into the termination area. The power MOSFET device also includes a drain region formed on the second surface of the semiconductor substrate structure. In selected embodiments, the integrated ballast resistor section may be a predetermined length and/or controlled sheet resistance to produce a positive bias in the body well region to mitigate avalanche hotspots in the trench field plate power MOSFET device.

In another form, there is provided a trench field plate power MOSFET device and associated method for fabricating same. In the disclosed method, a semiconductor substrate structure is provided that has a first surface and a second surface. In selected embodiments, the semiconductor substrate structure is a heavily doped n-type semiconductor substrate layer and a lightly doped n-type epitaxial semiconductor layer in which the first and second trenches are formed to define the narrow epitaxial semiconductor drift pillar structure. On the second surface of the semiconductor substrate structure, a drain region is formed. In selected embodiments, the drain region is formed by selectively implanting n-type impurities into the second surface of the semiconductor substrate structure to form one or more doped N++ drain regions. And in the first surface of the semiconductor substrate structure, first and second trenches are formed that are separated from one another by a narrow epitaxial semiconductor drift pillar structure which uniformly separates the first and second trenches and which extends down from the first surface of the semiconductor substrate structure. In selected embodiments, the first and second trenches are formed by patterning and etching the first surface of the semiconductor substrate to form the first trench to surround the second trench, to extend into the termination area, and to substantially align with a subset of the plurality of insulated gate electrode layers in the active area. In addition, the first surface of the semiconductor substrate may be patterned and etched to form the second trench as a first plurality of parallel trench openings formed in the first surface of the semiconductor substrate structure and connected together on one end with a connecting trench opening, where the first trench comprises a second plurality of parallel trench openings formed in the first surface of the semiconductor substrate structure to be interspersed with the first plurality of parallel trench openings and connected together on both ends with connecting trench openings to surround the second trench. In the first trench, a first insulated field plate layer is formed to be positioned in an upper portion of the first trench that is located outside an active area, and to be positioned in a lower portion of the first trench that is located inside the active area. In the second trench, a second insulated field plate layer is formed to be positioned in an upper portion of the second trench that is located outside the active area, and to be positioned in a lower portion of the second trench that is located inside the active area. In addition, a plurality of insulated gate electrode layers is formed in upper portions of the first and second trenches to be positioned over the first and second insulated field plate layers located inside the active area, thereby defining a termination area outside of the active area where the plurality of insulated gate electrode layers are located. And in an upper portion of the narrow epitaxial semiconductor drift pillar structure, a body well region is formed as a single, continuous serpentine shape that includes active sections located in the active area and termination sections located in the termination area. In selected embodiments, the body well region is formed by selectively implanting a p-type high voltage (PHV) well region in the narrow epitaxial semiconductor drift pillar structure to uniformly separate the first and second trenches in the active and termination areas. In the termination sections of the body well region, integrated ballast resistors are formed by selectively forming source contact regions in active sections of the body well region between the plurality of insulated gate electrode layers without forming source contact regions in termination sections of the body well region. In selected embodiments, the integrated ballast resistors are formed by forming a first patterned implant mask which exposes only the active sections of the body well region and which protects the termination sections of the body well region from implantation; and then selectively implanting a plurality of N+ source implant regions between the plurality of insulated gate electrode layers in active sections of the body well region exposed by the first patterned implant mask; and then removing the first patterned implant mask; and then forming a second patterned implant mask which exposes the active sections of the body well region and termination sections of body well region laterally adjacent to the plurality of insulated gate electrode layers, and which otherwise protects from implantation termination sections of the body well region not laterally adjacent to the plurality of insulated gate electrode layers; and them selectively implanting a plurality of P+ implant regions only in the body well region exposed by the second patterned implant mask to make contact with the plurality of N+ source implant regions, thereby forming integrated ballast resistors in the termination sections of the body well region not laterally adjacent to the plurality of insulated gate electrode layers. In other embodiments, the integrated ballast resistors are formed by forming a patterned implant mask which exposes only the active sections of the body well region and which otherwise protects from implantation the termination sections of the body well region; and then selectively implanting a plurality of N+ source implant regions between the plurality of insulated gate electrode layers in active sections of the body well region exposed by the patterned implant mask; and then selectively implanting a plurality of P+ implant regions between the plurality of insulated gate electrode layers only in active sections of the body well region exposed by the patterned implant mask. In other embodiments, the integrated ballast resistors are formed by forming the termination sections of the body well region which do not include source contact regions to have a predetermined length and/or controlled sheet resistance to produce a positive bias in the body well region to mitigate avalanche hotspots in the trench field plate power MOSFET device.

In yet another form, there is provided a semiconductor device and associated method for fabricating same. The disclosed semiconductor device includes a substrate having first and second substrate surfaces. The semiconductor device also includes a drain formed in the substrate on the second substrate surface. In addition, the semiconductor device includes a first trench formed in the substrate to extend from a top region of the first substrate surface of the semiconductor device to a bottom termination region of the first substrate surface. The semiconductor device also includes a second trench formed in the substrate to surround the first trench and extend to from the top region to the bottom termination region of the first substrate surface. In addition, the semiconductor device includes an epitaxial semiconductor drift pillar structure formed in the substate to uniformly separate the first and second trenches and extend from the top region to the bottom termination region of the first substrate surface. The semiconductor device also includes a first gate formed in the first trench at the first substrate surface to span a middle region between the top region and the bottom termination region of the first substrate surface. In addition, the semiconductor device includes a second gate formed in the second trench at the first substrate surface to span the middle region between the top region and the bottom termination region of the first substrate surface. The semiconductor device also includes a first partial shield formed in the first trench beneath the first gate to extend between the top region and the bottom termination region of the first substrate surface. In addition, the semiconductor device includes a first full shield formed in the second trench beneath the second gate to surround the first partial shield and to extend between the top region and the bottom termination region of the first substrate surface. The semiconductor device also includes a body well region formed in an upper portion of the epitaxial semiconductor drift pillar structure. In addition, the semiconductor device includes a source formed on the body well region between the first and second gates and in the middle region between the top region and the bottom termination region of the first substrate surface. The semiconductor device also includes one or more source contacts formed on the body well region adjacent to the first gate. In selected embodiments, the one or more source contacts include one or more first P+ source contacts formed on the body well region adjacent to a first side of the first gate, and also include one or more second N+/P+ source contacts formed on the body well region between the first and second gates. In other embodiments, the one or more source contacts include N+/P+ source contacts formed on the body well region only between the first and second gates. In addition, the semiconductor device includes an integrated ballast resistor formed in the epitaxial semiconductor drift pillar structure to extend from the one or more source contacts to the bottom termination region of the first substrate surface. As disclosed, the integrated ballast resistor is formed with a predetermined length of the body well region having a controlled sheet resistance to produce a positive bias in the body well region to mitigate avalanche hotspots in portions of the epitaxial semiconductor drift pillar structure below the bottom termination region of the first substrate surface. In selected embodiments, the source and one or more source contacts are not formed in the predetermined length of the body well region.

Although the described exemplary embodiments disclosed herein are directed to high power vertical field effect transistor device and methods for making same, the present disclosure is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are described with reference to NMOS vertical trench FET devices, this is merely for convenience of explanation and not intended to be limiting and persons of skill in the art will understand that the principles taught herein apply to devices formed with different types of devices. In addition, different dopant types and concentrations may be used than disclosed herein. Moreover, the dimensions of the described layers and regions may deviate from the disclosed dimension values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A trench field plate power MOSFET device, comprising:
    semiconductor substrate structure having a first surface and a second surface;
    first and second trenches formed in the first surface of the semiconductor substrate structure and separated from one another by a narrow epitaxial semiconductor drift pillar structure which uniformly separates the first and second trenches and which extends down from the first surface of the semiconductor substrate structure;
    a plurality of insulated gate electrode layers formed in upper portions of the first and second trenches to define (1) an active area which includes the plurality of insulated gate electrode layers, and (2) a termination area outside of the active area;
    a first insulated field plate layer formed in an upper portion of the first trench that is located outside of the active area;
    a second insulated field plate layer formed in a portion of the second trench that is located inside the active area, where the second insulated field plate layer is located below the plurality of insulated gate electrode layers in the active area;
    a body well region formed in an upper portion of the narrow epitaxial semiconductor drift pillar structure, the body well region comprising:
        a plurality of source contact regions adjacent to the plurality of insulated gate electrode layers, and
        an integrated ballast resistor section which connects one or more of the plurality of source contact regions to the termination area and which has no source contact regions; and
    a drain region formed on the second surface of the semiconductor substrate structure.

2. The trench field plate power MOSFET device of claim 1, where the semiconductor substrate structure comprises heavily doped n-type semiconductor substrate layer and a lightly doped n-type epitaxial semiconductor layer in which the first and second trenches are formed to define the narrow epitaxial semiconductor drift pillar structure.

3. The trench field plate power MOSFET device of claim 1, where the first trench is arrayed on the first surface of the semiconductor substrate structure to surround the second trench, to extend into the termination area, and to substantially align with a subset of the plurality of insulated gate electrode layers in the active area.

4. The trench field plate power MOSFET device of claim 3, where the second trench comprises a first plurality of parallel trench openings formed in the first surface of the semiconductor substrate structure and connected together on one end with a connecting trench opening, and where the first trench comprises a second plurality of parallel trench openings formed in the first surface of the semiconductor substrate structure to be interspersed with the first plurality of parallel trench openings and connected together on both ends with connecting trench openings to surround the second trench.

5. The trench field plate power MOSFET device of claim 1, where the body well region comprises a p-type high voltage (PHV) implant well region formed in the narrow epitaxial semiconductor drift pillar structure to uniformly separate the first and second trenches in the active and termination areas.

6. The trench field plate power MOSFET device of claim 5, where the plurality of source contact regions comprises:
    a plurality of N+ source implant regions formed in the PHV implant well region between the plurality of insulated gate electrode layers and within the active area; and
    a plurality of P+ implant regions formed in the PHV implant well region in alignment with the plurality of N+ source implant regions but not extending into the termination area.

7. The trench field plate power MOSFET device of claim 1, where integrated ballast resistor section comprises a predetermined length and/or controlled sheet resistance to produce a positive bias in the body well region to mitigate avalanche hotspots in the trench field plate power MOSFET device.

8. The trench field plate power MOSFET device of claim 2, where the first trench is arrayed on the first surface of the semiconductor substrate structure to surround the second trench, to extend into the termination area, and to substantially align with a subset of the plurality of insulated gate electrode layers in the active area.

9. The trench field plate power MOSFET device of claim 2, where the body well region comprises a p-type high voltage (PHV) implant well region formed in the narrow epitaxial semiconductor drift pillar structure to uniformly separate the first and second trenches in the active and termination areas.

10. The trench field plate power MOSFET device of claim 3, where the body well region comprises a p-type high voltage (PHV) implant well region formed in the narrow epitaxial semiconductor drift pillar structure to uniformly separate the first and second trenches in the active and termination areas.

11. The trench field plate power MOSFET device of claim 2, where integrated ballast resistor section comprises a predetermined length and/or controlled sheet resistance to produce a positive bias in the body well region to mitigate avalanche hotspots in the trench field plate power MOSFET device.

12. A semiconductor device comprising:
a substrate having first and second substrate surfaces;
a drain formed in the substrate on the second substrate surface;
a first trench formed in the substrate to extend from a top region of the first substrate surface of the semiconductor device to a bottom termination region of the first substrate surface;
a second trench formed in the substrate to surround the first trench and extend to from the top region to the bottom termination region of the first substrate surface;
an epitaxial semiconductor drift pillar structure formed in the substrate to uniformly separate the first and second trenches and extend from the top region to the bottom termination region of the first substrate surface;
a first gate formed in the first trench at the first substrate surface to span a middle region between the top region and the bottom termination region of the first substrate surface;
a second gate formed in the second trench at the first substrate surface to span the middle region between the top region and the bottom termination region of the first substrate surface;
a first partial shield formed in the first trench beneath the first gate to extend between the top region and the bottom termination region of the first substrate surface;
a first full shield formed in the second trench beneath the second gate to surround the first partial shield and to extend between the top region and the bottom termination region of the first substrate surface;
a body well region formed in an upper portion of the epitaxial semiconductor drift pillar structure;
a source formed on the body well region between the first and second gates and in the middle region between the top region and the bottom termination region of the first substrate surface;
one or more source contacts formed on the body well region adjacent to the first gate; and
an integrated ballast resistor formed in the epitaxial semiconductor drift pillar structure to extend from the one or more source contacts to the bottom termination region of the first substrate surface, where the integrated ballast resistor comprises a predetermined length of the body well region having a controlled sheet resistance to produce a positive bias in the body well region to mitigate avalanche hotspots in portions of the epitaxial semiconductor drift pillar structure below the bottom termination region of the first substrate surface,
wherein the source, the first and second gates, and the drain are terminals of a field effect transistor.

13. The semiconductor device of claim 12, where the source and one or more source contacts are not formed in the predetermined length of the body well region.

14. The semiconductor device of claim 12, where the one or more source contacts comprise:
one or more first P+ source contacts formed on the body well region adjacent to a first side of the first gate; and
one or more second P+ source contacts formed on the body well region between the first gate and the second gate.

15. The semiconductor device of claim 12, where the one or more source contacts are P+ source contacts formed on the body well region only between the first gate and the second gate.

16. The semiconductor device of claim 13, where the one or more source contacts comprise:
one or more first P+ source contacts formed on the body well region adjacent to a first side of the first gate; and
one or more second P+ source contacts formed on the body well region between the first gate and the second gate.

17. The semiconductor device of claim 13 where the one or more source contacts are P+ source contacts formed on the body well region only between the first gate and the second gate.

18. The semiconductor device of claim 14 where the one or more source contacts are P+ source contacts formed on the body well region only between the first gate and the second gate.

19. The semiconductor device of claim 15 where the one or more source contacts are P+ source contacts formed on the body well region only between the first gate and the second gate.

* * * * *